(12) United States Patent
Koyata et al.

(10) Patent No.: US 7,906,438 B2
(45) Date of Patent: Mar. 15, 2011

(54) SINGLE WAFER ETCHING METHOD

(75) Inventors: Sakae Koyata, Tokyo (JP); Tomohiro Hashii, Tokyo (JP); Katsuhiko Murayama, Tokyo (JP); Kazushige Takaishi, Tokyo (JP); Takeo Katoh, Tokyo (JP)

(73) Assignee: Sumco Corporation, Tokyo (JP)

( * ) Notice: Subject to any disclaimer, the term of this patent is extended or adjusted under 35 U.S.C. 154(b) by 209 days.

(21) Appl. No.: 11/669,431

(22) Filed: Jan. 31, 2007

(65) Prior Publication Data
US 2007/0175863 A1    Aug. 2, 2007

(30) Foreign Application Priority Data
Jan. 31, 2006   (JP) ................... 2006-021899

(51) Int. Cl.
*H01L 21/302* (2006.01)
*H01L 21/461* (2006.01)
(52) U.S. Cl. ........................ 438/745; 438/747
(58) Field of Classification Search .................. None
See application file for complete search history.

(56) References Cited

U.S. PATENT DOCUMENTS

| | | | |
|---|---|---|---|
| 5,127,984 A * | 7/1992 | Hua et al. | 438/748 |
| 5,492,566 A * | 2/1996 | Sumnitsch | 118/500 |
| 6,096,233 A * | 8/2000 | Taniyama et al. | 216/92 |
| 6,432,837 B2 * | 8/2002 | Nihonmatsu et al. | 438/749 |
| 7,439,190 B2 * | 10/2008 | Tanaka | 438/756 |

FOREIGN PATENT DOCUMENTS

| | | |
|---|---|---|
| JP | 11-135464 A | 5/1999 |
| KR | 2003-0081607 A | 10/2003 |
| KR | 10-2005-0116303 A | 12/2005 |

* cited by examiner

*Primary Examiner* — Duy-Vu N Deo
(74) *Attorney, Agent, or Firm* — Greenblum & Bernstein, P.L.C.

(57) ABSTRACT

An object of the present invention is to provide a single wafer etching apparatus realizing a high flatness of wafers and an increase in productivity thereof. In the single wafer etching apparatus, a single thin disk-like wafer sliced from a silicon single crystal ingot is mounted on a wafer chuck and spun thereon, and an overall front surface of the wafer is etched with an etching solution supplied thereto by centrifugal force generated by spinning the wafer 11. The singe wafer etching apparatus includes a plurality of supply nozzles 26, 27 capable of discharging the etching solution 14 from discharge openings 26a, 27a onto the front surface of the wafer 11, nozzle-moving devices each capable of independently moving the plurality of supply nozzles 28, 29, and an etching solution supplying device 30 for supplying the etching solution 14 to each of the plurality of supply nozzles and discharging the etching solution 14 from each of the discharge openings to the front surface of the wafer 11.

5 Claims, 4 Drawing Sheets

SINGLE WAFER ETCHING METHOD

BACKGROUND OF THE INVENTION

1. Field of the Invention

The present invention relates to an apparatus for etching the front surface of a wafer one by one by centrifugal force, where the wafer is rotated while an etching solution is supplied onto the front surface of the wafer; and to a method therefor.

2. Description of the Related Art

In general, the process for manufacturing a semiconductor wafer comprises the steps of obtaining wafers by cutting and slicing out of a single crystal ingot, and chamfering the respective wafers, mechanical grinding (lapping), etching, mirror-polishing, and cleaning, thereby producing a wafer with highly precise flatness. The wafer, which has been subjected to the steps for mechanical processing, such as block-cutting, rounding, slicing, and lapping, has a damaged layer (i.e., a work-degenerated layer) on the surface thereof. In the process for device production, such a work-degenerated layer causes crystal defects, such as slip dislocation, and the mechanical strength of the wafer is then decreased. In addition, it has adverse effects on electric characteristics. Therefore, the work-degenerated layer should be completely removed. For removing such a work-degenerated layer, an etching process is carried out. There are two types of etching: dip-etching and single wafer etching.

Among the etching processes, the single wafer etching has been regarded as the most suitable etching process, which enables the control of the texture-size and surface roughness of a large-sized wafer. The single wafer etching is a process comprising dropping an etching solution onto the front surface of a flattened single wafer and rotating (spinning) the wafer to spread out the dripped etching solution over the front surface of the wafer. The etching solution supplied on the wafer is spread out over the surface of the wafer from a supplied point by centrifugal force caused by spinning the wafer, and finally reaches the edge of the wafer, so that the edge thereof as well as the front surface of that can be also etched at the same time. Furthermore, most of the etching solution supplied is blown off from the edge thereof by centrifugal force and then collected into a cup or the like arranged on an etching device.

However, in the single wafer etching, the etching solution is quantitatively dripped through a single supply nozzle, so that etching amount may vary. As a result, the front and back surfaces of a silicon wafer, subjected to the etching process, have deficiencies that the flatness of the wafer cannot be maintained after the flattening process including lapping and grinding. In addition, the desired surface roughness of the wafer cannot be obtained. Therefore, for improving the flatness and surface roughness thereof, a large amount of grinding margin is required in the mirror polishing process, so that the subsequent steps in mirror polishing will bear a heavy burden.

Therefore, as a process for manufacturing a semiconductor wafer that can effectively remove a processing-strained layer caused by mechanical grinding and retain the flatness of the wafer, there is disclosed one including the following steps; slicing a silicon single crystal ingot; chamfering the end face of the sliced wafer; flattening at least the front surface thereof obtained by slicing the semiconductor ingot by means of surface grinding or lapping; spin-etching the flattened front surface thereof; and polishing the etched front surface of the wafer into a mirror surface (e.g., see Patent Document 1).

Patent Document 1

Japanese Unexamined Patent Application Publication No. 11-135464 (Claim 1, FIG. 1)

However, the process disclosed in Patent Document 1 causes grinding traces and undulations on the wafer surface by holding the wafer at the time of grinding by mechanical grinding or the like in the flattening process. Therefore, a large amount of grinding margin is required not only for removing the processing-strained layer but also removing the grinding traces and undulations in the steps subsequent to the flattening process. Thus, the grinding process bears a heavy burden.

SUMMARY OF THE INVENTION

Accordingly, the object of the present invention is to provide a single wafer etching apparatus that attains high flatness and high productivity and a method for single wafer etching.

The invention of claim 1 is an improvement of a single wafer etching apparatus, wherein a single thin disk-like wafer sliced from a silicon single crystal ingot is mounted on a wafer chuck and spun thereon, and an overall front surface of the wafer is etched with an etching solution supplied thereto by centrifugal force generated by spinning the wafer.

The characteristic feature thereof lies in the configuration, comprising a plurality of supply nozzles capable of discharging the etching solution from discharge openings onto the front surface of the wafer; nozzle-moving devices for independently moving each of the plurality of supply nozzles; and an etching solution supplying device for supplying the etching solution to each of the plurality of supply nozzles and discharging the etching solution respectively from the discharge openings to the front surface of the wafer.

In the single wafer etching apparatus as described in claim 1, when the etching solution is supplied on the front surface of the wafer, the etching solution etches the front surface of the wafer as it gradually moves from a supplied point to the periphery of the wafer. The etching solution is discharged from the respective discharge openings of the plurality of supply nozzles. In this case, the etching solutions discharged from the different nozzles interfere with each other, so that the movements of the nozzles may be optimized to increase the degree of freedom to control the distribution of etching amount on the surface of the wafer. Therefore, even if grinding traces or undulations are caused on the surface of the wafer, these grinding traces or undulations can be surely removed. As a result, high flatness can be effectively attained at the time of etching the wafer and the productivity thereof can be increased.

The invention of claim 2 is related to the invention of claim 1, wherein at least one of the supply nozzles is an oscillating supply nozzle whose tip has a discharge opening and oscillates around its base end, and at least another one of the supply nozzles is a directly-moving supply nozzle whose tip has a discharge opening and directly moves in an axial direction.

In the single wafer etching apparatus as described in claim 2, the oscillating supply nozzles and the directly-moving supply nozzle are provided, so that the surface of the wafer is etched while these nozzles move on different paths. As a result, the degree of freedom to control the distribution of etching amount on the surface of the wafer can be increased more than that of supply nozzles in the same movement system, so that grinding traces and undulations can be more effectively removed from the surface of the wafer.

The invention of claim 3 is related to the invention of claim 1 or 2, further comprising: sensors capable of measuring the thickness of the silicon wafer provided on a tip of any one or all of the plurality of supply nozzles; and a controller for controlling one or both of the nozzle-moving devices and the etching solution supplying device according to detection output from the sensor.

In the single wafer etching apparatus as described in claim 3, the thickness of the wafer during etching can be detected. The controller controls the moving speeds of the supply nozzles and the amount of the etching solution supplied according to the detection output, so that the thickness thereof can be feedbacked in real time to the controller to improve the accuracy of etching, so that variation in the wafer thickness can be prevented.

The invention of claim 4 is an improvement of a method for single wafer etching, wherein a single thin disk-like silicon wafer sliced from a silicon single crystal ingot is mounted on a wafer chuck and then spun thereon, and an overall front surface of the wafer is etched with an etching solution supplied thereto by centrifugal force generated by spinning the wafer.

The characteristic point thereof lies in the configuration, comprising the steps of: supplying the etching solution onto the front surface of the wafer by a plurality of supply nozzles, carrying out the supply of the etching solution while independently moving each of the plurality of supply nozzles; and controlling the amount of the etching solution supplied from the supply nozzles according to the thickness of the corresponding portion of the wafer.

In the method for single wafer etching as described in claim 4, the amount of the etching solution supplied is controlled according to the thickness of the corresponding portion of the wafer, so that the accuracy of etching can be increased while variation in the wafer thickness can be prevented, which realizes uniform thickness thereof, and facilitates the subsequent step of grinding.

As described above, according to the present invention, there are provided: a plurality of supply nozzles capable of discharging an etching solution onto the front surface thereof; nozzle-moving devices each capable of independently moving the plurality of supply nozzles; and an etching solution supplying device that supplies the etching solution to each of the plurality of supply nozzles, to discharge the etching solution respectively onto the front surface thereof. The movement of a plurality of nozzles can be optimized and the degree of freedom to control the distribution of etching amount on the surface thereof can be thus increased. Thus, even if undulations are caused on the surface of the wafer, grinding trace as well as undulations can be surely removed. As a result, a high degree of flatness of the wafer can be effectively attained in etching and the productivity thereof can be thus increased. In addition, an oscillating discharge nozzle and a directly-moving supply nozzle, if provided, can be allowed to move on different paths to etch the surface of the wafer. Thus, the distribution of etching amount on the surface of the wafer can be controlled at a higher degree of freedom, so that the grinding traces and undulations are effectively removed from the surface of the wafer.

Furthermore, the tip of one or all of a plurality of supply nozzles may be provided with a sensor capable of measuring the thickness of a silicon wafer. By providing a controller controlling one or both of the nozzle-moving device and the etching solution supplying device according to a detection output from the sensor, the thickness of the wafer during etching can be detected and the thickness of the wafer can be feedbacked in real time, so that variation in the wafer thickness can be prevented.

Furthermore, an etching solution may be supplied from a plurality of supply nozzles onto the front surface of the wafer while the respective supply nozzles may independently moved so as to supply etching solution and the amount of the etching solution supplied from each supply nozzle may be controlled according to the thickness of the corresponding portion of the wafer. Such a configuration will attain an improvement in accuracy of etching and prevent variation in the wafer thickness, while the thickness of the wafer after etching can be uniformed. Therefore, the wafer can be easily subjected to the subsequent steps of grinding.

DETAILED DESCRIPTION OF THE PREFERRED EMBODIMENTS

Hereinafter, preferred embodiments for carrying out the present invention will be described in more details with reference to the attached drawings.

Figure 1:
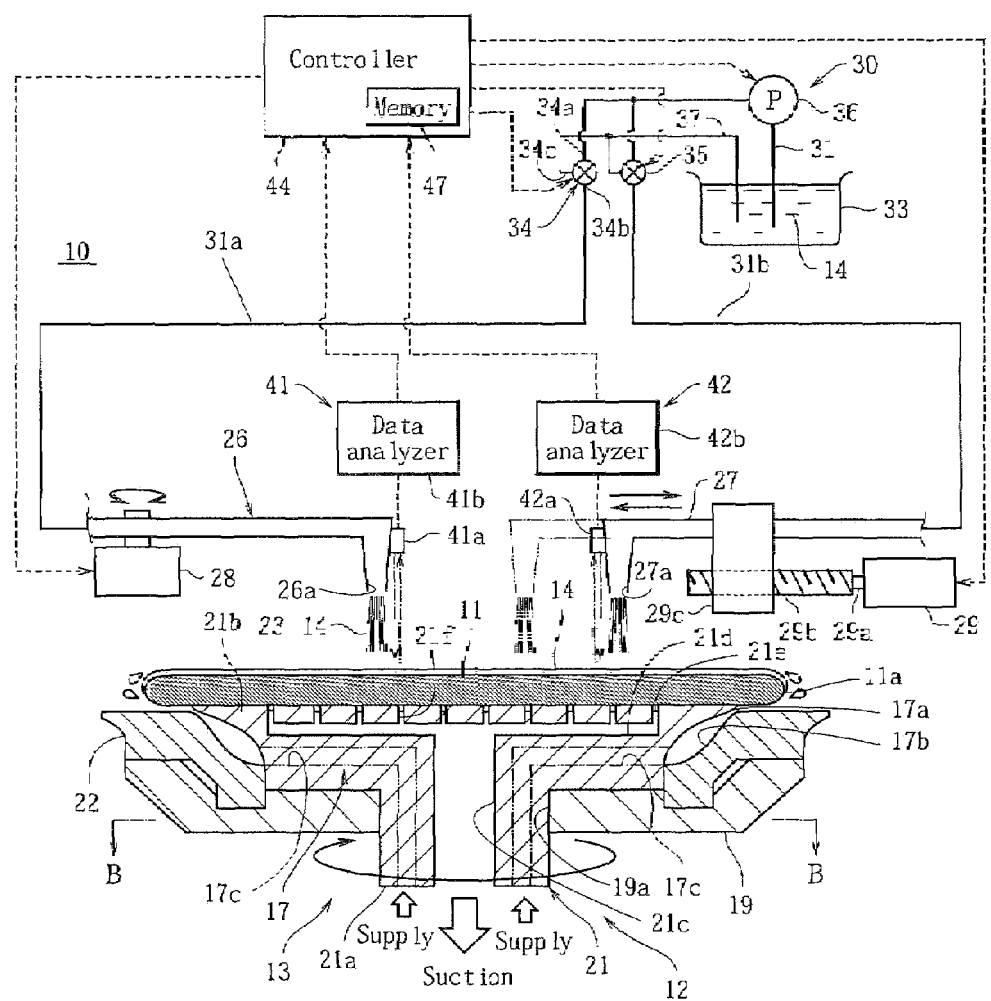
FIG. 1 is a vertical cross-sectional view of the configuration of a main-part of a single wafer etching apparatus according to an embodiment of the present invention.

As shown in FIG. 1, a silicon single wafer etching apparatus 10 comprises a wafer chuck 12 housed in a chamber, on which a thin disk-like silicon wafer 11 is mounted and retained horizontally, a spinning device 13 for spinning the wafer 11 around its vertical axis in horizontal plane, and a gas-discharging mechanism 17 for blowing out the etching solution 14 flown down along an edge portion 11a of the wafer 11 mounted on the chuck 12 to outside in the radial direction of the wafer 11 by discharging gas. The wafer 11 is obtained by slicing a silicon single crystal ingot and the periphery (i.e., edge portion 11a) of the wafer 11 is convexly chamfered to have a predetermined curvature radius.

The wafer chuck 12 comprises a disk-like base member 19 having a diameter larger than that of the wafer 11 and a holding axis 21 in which an axial part 21a is inserted through a through hole 19a formed in the center of the base member 19 and extended in the vertical direction. The holding axis 21 comprises the axial part 21a; a wafer-receiving part 21b having a large diameter, which is integrally formed with the axial part 21a and arranged on the front surface of the axial part 21a; a through hole 21c, which is formed in the center of the holding axis 21 and extends from the bottom face to the top of the holding axis 21 in the vertical direction; a plurality of communicating holes 21d each having an end communicating with the upper end of the through hole 21c and an opposite closed end, where the communicating holes 21d radiate outward around the through hole 21c in the radial direction of the wafer-receiving part 21b; a plurality of ring grooves 21e concentrically formed in the front surface of the wafer-receiving part 21b; and a plurality of small pores 21f allowing the communicating holes 21d and the ring grooves 21e to communicate with each other. A vacuum pump (not shown) is connected and communicated with the bottom end of the through hole 21c. The outer diameter of the wafer-receiving part 21b is larger than that of the axial part 21a and smaller than that of the wafer 11. The front surface of the wafer-receiving part 21b is configured to mount the wafer 11 concentrically with the wafer-receiving part 21b. The vacuum pump (not shown) is driven to make the inner pressure of the through hole 21c negative, causing negative pressures in communicating holes 21d, small pores 21f, and ring groups 21e. Thus, the rear surface of the wafer 11 is adsorbed onto the wafer-receiving part 21b of the holding axis 21 to retain the wafer 11 horizontally. In addition, the spinning device 13 comprises the holding axis 21, a driving motor (not shown) for rotating the holding axis 21. It is configured that the driving motor rotates the holding axis 21 to allow the wafer 11 retained on the holding axis 21 to be spun with the holding axis 21.

On the other hand, the gas-discharging mechanism 17 comprises a ring-shaped discharge opening 17a formed in the top of the chuck 12 and extended in the circumferential direction of the chuck 12; a ring-shaped discharge opening 17b formed in the chuck 12, where the upper end thereof communicates with the discharge opening 17a; and a gas-supplying device (not shown) communicating with the discharge groove 17b. The discharge opening 17a is formed to face the bottom face of the wafer 11 in the vicinity of the edge portion 11a. The above discharge groove 17b is formed by attaching both the wafer-receiving part 21b and a taper member 22 on the front surface of a base member 19 in a concentric pattern to the base member 19. The discharge groove 17b is formed such that the diameter thereof gradually decreases downward and becomes gradually narrow upward and narrowest at the discharge opening 17a. The lower part of the discharge groove 17b communicates with one end of each of four gas-supplying holes 17c formed from the wafer-receiving part 21b to the axial part 21a and the other ends of the gas-supplying hole 17c is connected to the gas-supplying device. The gas-supplying device is constructed of a compressor for compressing gas such as nitrogen gas or air. The gas compressed by the gas-supplying device is supplied to the discharge opening 17a through the gas-supplying hole 17c and the discharge groove 17b.

Figure 2:
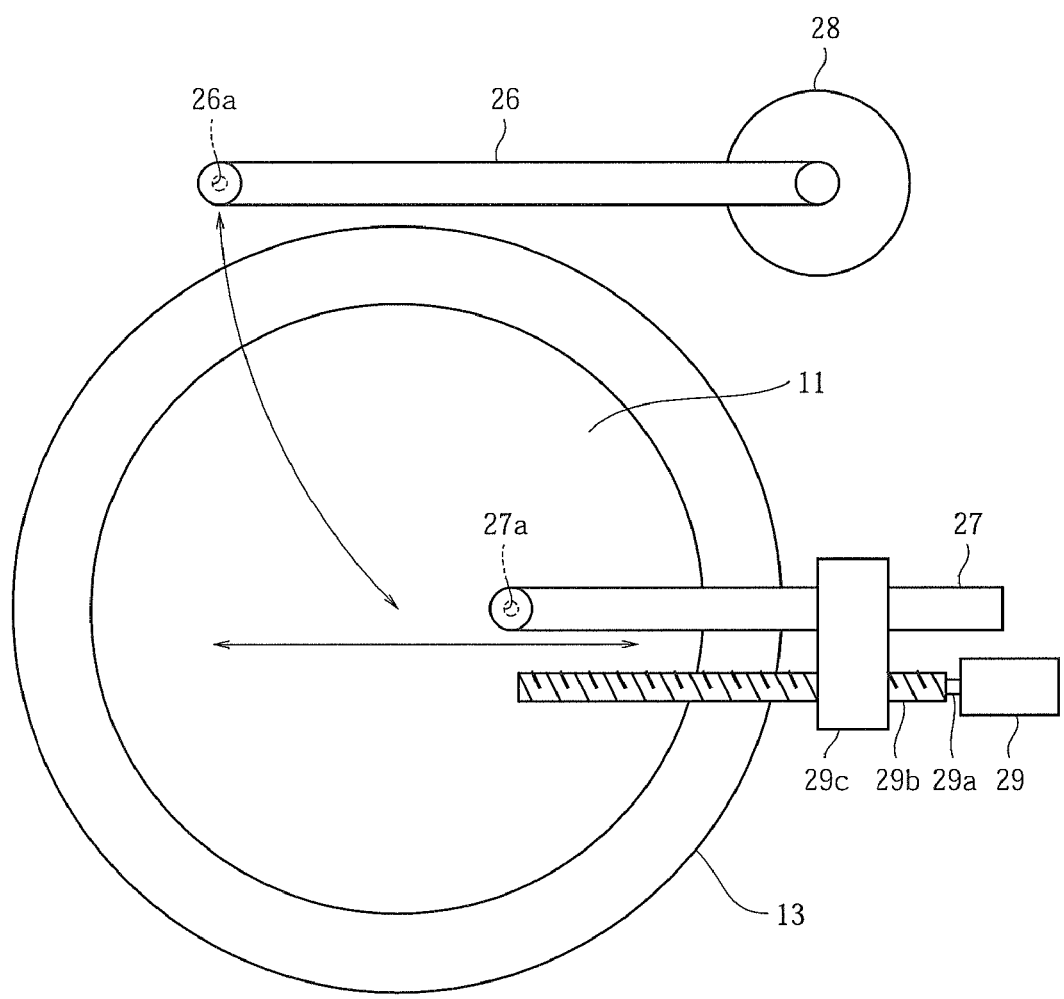
FIG. 2 is a top view showing the relationship of a supply nozzle of the apparatus and a wafer.

Furthermore, as shown in FIGS. 1 and 2, the single wafer etching apparatus 10 is provided with a plurality of supply nozzles 26, 27 capable of discharging an etching solution 14 to the front surface of the wafer 11 from the respective discharge openings 26a, 27a. In the present embodiment, the apparatus shown in the figure has two supply nozzles, wherein respective nozzle-moving devices 28, 29 independently move two supply nozzles 26, 27, respectively. The nozzle-moving device 28 that moves the supply nozzle 26 is mounted on the base end of the supply nozzle 26 and is a stepping motor that oscillates the tip of the supply nozzle 26 around the base end. Furthermore, a discharge opening 26a is formed in the oscillating tip of the supply nozzle 26. The other nozzle-moving device 29 is a rotary motor that directly moves the other supply nozzle 27 in the axial direction. The rotational axis 29a of the nozzle-moving device 29 is coaxially connected to a ball screw 29b, while the other supply nozzle 27 is attached with an internal thread member 29c which can be threadably mounted on the ball screw 29b. By allowing the ball screw 29b to rotate by the rotational axis 29a of the rotary motor 29, the other supply nozzle 28 moves directly in the axial direction together with the internal thread member 29c.

Referring again to FIG. 1, two supply nozzles 26, 27 are connected with an etching solution supplying device 30, which supply the etching solution 14 to them and allow the respective discharge openings 26a, 27a of the supply nozzles 26, 27 to discharge the etching solution 14 onto the front surface of the wafer 11. The etching solution supplying device 30 comprises a liquid supply main pipe 31. One supply nozzle 26 is connected to one end of a first liquid supply pipe 31a and the other supply nozzle 27 is connected to one end of a second liquid supply tube 31b. One end of the liquid supply main tube 31 is connected to each of the other ends of the first and second liquid supply tubes 31a, 31b. The other end of the liquid supply main tube 31 is connected to a liquid tank 33 in which the etching solution 14 is reserved. Furthermore, the liquid supply main tube 31 is provided with a pump 36 that allows the supply of the etching solution 14 in the liquid tank 33 to each of the supply nozzles 26, 27.

A first liquid regulator 34 is mounted on the first liquid supply tube 31a, where the first liquid regulator 34 adjusts the amount of the etching solution 14 to be supplied to one supply nozzle 26. A second liquid regulator 35 is mounted on the second liquid supply tube 31b, where the second liquid regulator 35 adjusts the amount of the etching solution 14 to be supplied to the other supply nozzle 27. The first and second liquid regulators 34, 35 are the same products. Thus, the configuration of the first liquid regulator 34 will be described on behalf of these regulators. The first liquid regulator 34 is a three-way valve having first to third ports 34a to 34c. The first port 34a is connected to a discharge opening of a pump 36, the second port 34b is connected to the supply nozzle 26, and the third port 34c is connected to the liquid tank 33 through a return tube 37. Furthermore, when the first liquid regulator 34 is switched on, the first and second ports 34a, 34b are then allowed to communicate with each other. When it is switched off, the first and third ports 34a, 34c are allowed to communicate with each other.

Sensors 41, 42, which perform non-contact measurements of the thickness of the silicon wafer 11, are mounted on the tips of two supply nozzles 26, 27, respectively. The sensors 41, 42 are provided with probe heads actually attached on the tips of two supply nozzles 26, 27 and data-analyzers 41b, 42b, where the probe heads 41a, 42a are configured to irradiate the wafer 11 with far-red light at a wavelength of about 1.3 micrometers and receive its reflected light. On the other hand, the data analyzers 41b, 42b analyze the reflected light received by the probe heads 41a, 42a to measure the thickness of the irradiated part of the wafer 11 with the far-red light and the measuring results are output as detection outputs from these sensors 41, 42. Furthermore, each detection output from each of the sensors 41, 42 is connected to a control input of a controller 44 composed of a microcomputer and a control output from the controller 44 is connected to each of motors 28, 29 that constitute the first and second liquid regulators 34, 35, pump 36, and nozzle-moving devices.

The controller 44 includes a memory 44. The memory 47 previously stores information from the sensors 41, 42, including on-times and intervals thereof of the first and second liquid regulators 34, 35 depending on the measured thickness of the silicon wafer 11, the rotary speeds and directions of the respective motors 28, 29, and the presence or absence of actuation of the pump 36. Then, the controller 44 is configured so as to regulate the supply amount of etching solution 14 from each of the supply nozzles 26, 27 depending on the thickness of the corresponding part of the wafer 11. More specifically, when the thicknesses of the silicon wafer 11 measured by the sensors 41, 42 are comparatively thick, the controller 44 decreases the moving speeds of supply nozzles 26, 27 or controls so as to increase the amount of the etching solution 14 discharged from the supply nozzles 26, 27 to increase the amount of etching. When the thicknesses of silicon wafer 11 measured by the sensors 41, 42 are comparatively thin, the controller 44 raises the moving speeds of supply nozzles 26, 27 or controls so as to decrease the amount of the etching solution 14 discharged from the supply nozzles 26, 27 to decrease the amount of etching.

The movement of the single wafer etching apparatus 10 for the wafer 11, which is configured as described above, will be described below.

At first, in the state that the wafer 11 is mounted on the wafer-receiving part 21b of the holding axis 21, the vacuum pump, which is connected to and communicated with the bottom end of the through hole 21a of the holding axis 21, is actuated to make the pressure of the through hole 21c negative, and the negative pressure then retains the wafer 11. In this state, the driving motor of the spinning device 13 is actuated to allow the wafer 11 to spin in horizontal plane with the holding axis 21. Subsequently, the gas supplying device of the gas-discharging mechanism 17 is actuated to discharge compression gas composed of nitrogen gas or air from the discharge opening 17a through the gas-supplying hole 17c and the discharge groove 17b, thereby forming a gas stream between the front surface of the taper member 22 and the rear surface of the wafer 11 which flows toward the outside in the radial direction of the wafer 11.

Subsequently, the controller 44 actuates the stepping motor 28 and the rotary motor 29, which constitute the respective nozzle-moving devices, to oscillate one supply nozzle 26 and independently move the other supply nozzle 27 in its axial direction. Simultaneously, the controller 44 actuates the pump 36 while switching the first and second liquid regulators 34, 35 on to supply the etching solution 14 from the discharge openings 26a, 27a of two supply nozzles 26, 27 onto the front surface of the wafer 11, respectively. The etching solution 14 supplied on the front surface of the wafer 11 gradually moves toward the edge portion 11a of the wafer 11 while etching the work-degenerated layer on the front surface of the wafer 11 from the point where the etching solution 14 is supplied (e.g., near the center of the front surface of the wafer 11) by centrifugal force generated with the spinning movement of the wafer 11 in horizontal plane. The centrifugal force with the spinning movement of the wafer 11 makes most of the etching solution 14 on the wafer 11 into droplets and scatters these droplets outside of the wafer 11, followed by discharging them outside of the chamber.

Here, the etching solution 14 for etching the front surface of the wafer 11 can be discharged from both the discharge openings 26a, 27a of the respective two supply nozzles 26, 27, so that the etching solution 14 therefrom may cause liquid interference. However, optimizing the movements of nozzles 26, 27 increase the degree of freedom to control the distribution of etching amount on the surface of the wafer 11. In addition, even if grinding trances or undulations are caused on the surface of the wafer, grinding trace as well as undulations can be surely removed. As a result, a high degree of flatness of the wafer can be effectively attained during etching and the productivity thereof can be thus increased. In addition, an oscillating discharge nozzle 26 and a directly-moving supply nozzle 27, provided in this embodiment, can realize the movement different paths to etch the surface of the wafer. Thus, the distribution of etching amount on the surface of the wafer 11 can be controlled at a higher degree of freedom, so that the grinding traces and undulations are effectively removed from the surface of the wafer.

Furthermore, in the single wafer etching apparatus 10, sensors 41, 42 that can measure the thickness of the wafer 11 are provided on the tips of supply nozzles 26, 27, so that the thickness thereof during etching can be detected. Therefore, since the controller 44 controls the moving speeds of the supply nozzles 26, 27 and the amount of the etching solution 14 supplied according to the detection output, the thickness thereof can be feedbacked in real time to the controller 44 to thereby improve the accuracy of etching, so that variation in the wafer thickness can be prevented. In addition, the amount of the etching solution 14 supplied supply nozzles 26, 27 is controlled according to the thickness of the corresponding portion of the wafer 11, so that the accuracy of etching can be increased while the variation in the wafer thickness can be prevented, which realizes uniform thickness thereof facilitates the subsequent step of grinding thereof. Therefore, the wafer can be etched to a desired thickness even after slicing, and the conventionally-required lapping or grinding step may be also skipped.

Figure 3:
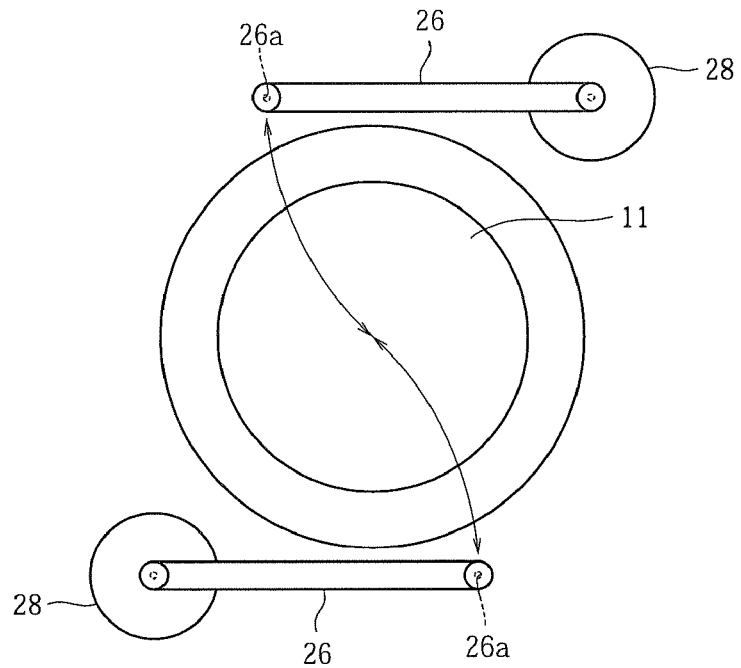
FIG. 3 is another top view showing the relationship of the supply nozzle and the wafer.

Furthermore, in the embodiment described above, there has been described an exemplified case where two supply nozzles are provided with the etching device, one of which has a tip that oscillates around its base end and the other of which is capable of directly moving in the axial direction. Alternatively, as another exemplified case where two supply nozzles are provided, both supply nozzles may be ones of which respective tips oscillate around the respective base ends as shown in FIG. 3, or both supply nozzles may be directly-moving ones (not shown).

Figure 4:
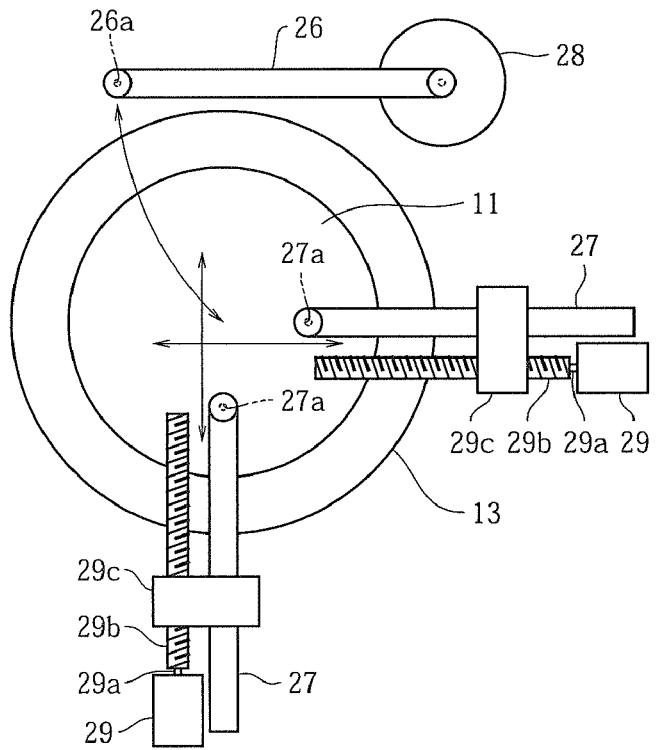
FIG. 4 is still another top view showing the relationship of the supply nozzle and the wafer.

Furthermore, the embodiment described above is the case in which the number of supply nozzles is two. However, the number of supply nuzzles may be three as shown in FIG. 4, or may be 4 or more (not shown).

EXAMPLES

Next, an Example of the present invention will be described in more detail with reference to a Comparative Example.

Example 1

At first, a wafer obtained by slicing a silicon single crystal ingot was subjected to chamfering and mechanical grinding (lapping), so that there was also prepared a silicon wafer 11 of 300 mm in diameter of which front and back surfaces were flattened. In addition, there was prepared an etching solution 14 containing hydrofluoric acid, nitric acid, phosphoric acid, and water at a mixing ratio (% by weight) of 7%:30%:35%:28% (hydrofluoric acid:nitric acid:phosphoric acid:water) was also prepared. Subsequently, the wafer 11 was mounted on the chuck 12 of the single wafer etching apparatus 10 shown in FIG. 1 such that the front surface of the wafer 11 is faced upwardly. Then, the etching solution 14 was supplied from two supply nozzles 26, 27 arranged above the wafer. By centrifugal force generated by the horizontal spinning, the etching solution 14 was spread out from the front surface to the side end thereof to etch a work-degenerated layer caused by the planarization processing.

Here, the etching solution 14 was supplied 4 liters/minute from one supply nozzle 26 and 3 liters/minute from the other supply nozzle 27. In addition, the oscillation speed of one supply nozzle 26 was determined so that the tip of the discharge opening 26a could move at a speed of 2 mm/minute. In other hand, the speed of the other supply nozzle 27 was determined so that the other nozzle 27 could move at the speed of 3 mm/minute in the axial direction. The surface of silicon wafer 11 was etched 20 micrometers in depth under such conditions.

Comparative Example 1

The etching solution was supplied from a single oscillating supply nozzle. Specifically, the etching solution was supplied 4 liters/minute from the supply nozzle. The oscillation speed of the single supply nozzle was determined so that the tip thereof could move at a speed of 26 mm/minute. Other than this condition, the surface of the silicon wafer was etched 20 micrometers in total in the same manner as that of Example 1.

Competitive Experiment and Evaluation

Figure 5:
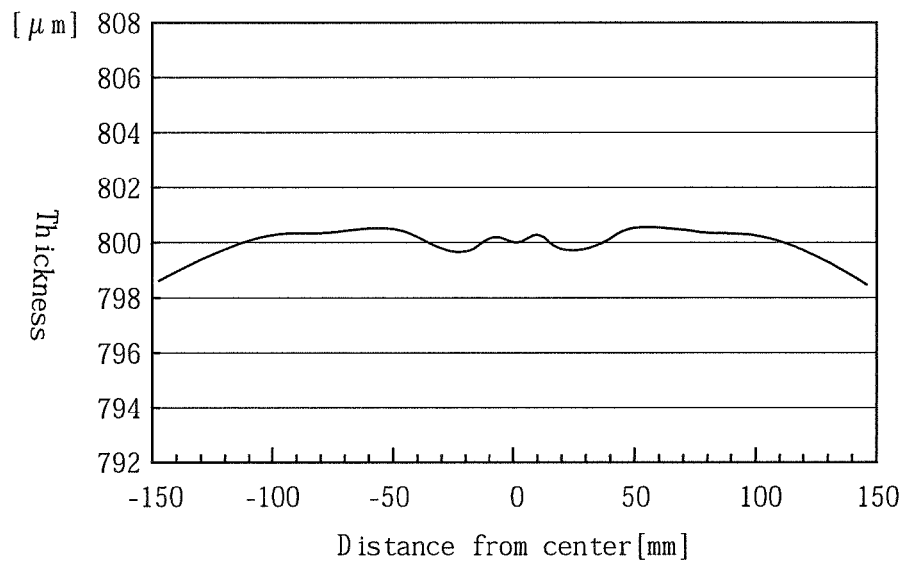
FIG. 5 is a figure showing variations in thickness of the wafer in Example 1.
Figure 6:
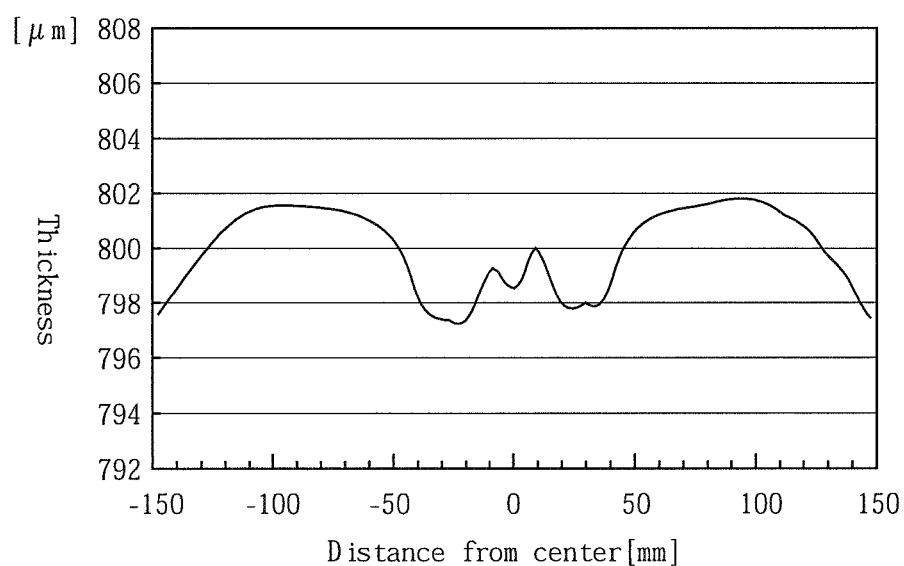
FIG. 6 is a figure showing variations in thickness of the wafer in Comparative Example 1.

Thickness of the silicon wafers, on which the single wafer etching was performed according to Example 1 and Comparative Example 1, was measured using a flatness-measuring equipment (Wafercom, manufactured by Doi Precision Lapping Co., Ltd.). The measuring results in Example 1 are shown in FIG. 5 and the measuring results in Comparative Example 1 are shown in FIG. 6. As is evident from FIGS. 5 and 6, the surface of the wafer 11 in FIG. 5 etched by supplying the etching solution from a plurality of supply nozzles is flatter than that in FIG. 6 etched by supplying the etching solution from the single supply nozzle. As a result, this invention to supply an etching solution from a plurality of supply nozzles can realize high flatness of wafers as well as high productivity thereof.

What is claimed is:

1. A method for single wafer etching, wherein a single thin disk-like silicon wafer sliced from a silicon single crystal ingot is mounted on a wafer chuck and spun thereon, and an overall front surface of the wafer is etched with an etching solution supplied thereto by centrifugal force generated by spinning the wafer, comprising:

supplying the etching solution onto the front surface of the wafer by a plurality of supply nozzles, carrying out the supply of the etching solution while independently moving each of the plurality of supply nozzles;

measuring thicknesses of corresponding portions of the wafer during etching by a plurality of sensors provided on respective tips of the plurality of supply nozzles; and controlling the amount of the etching solution supplied from the supply nozzles according to the measured wafer thicknesses of the corresponding portions of the wafer, whereby the method prevents variation in the wafer thickness.

2. The method of claim 1, wherein the method is carried out using an apparatus comprising:

the plurality of supply nozzles, the plurality of supply nozzles having discharge openings capable of discharging the etching solution from the discharge openings onto the front surface of the wafer;

nozzle-moving devices for independently moving each of the plurality of supply nozzles about the overall front surface of the wafer mounted on the chuck; and an etching solution supplying device for supplying the etching solution to each of the plurality of supply nozzles and discharging the etching solution, respectively, from the discharge openings onto the front surface of the wafer, wherein the discharge openings are formed to face a rear surface of the wafer in the vicinity of an edge portion.

3. The method of claim 1, wherein the method is carried out using an apparatus comprising:

the plurality of supply nozzles, the plurality of supply nozzles having discharge openings capable of discharging the etching solution from the discharge openings onto the front surface of the wafer;

nozzle-moving devices for independently moving each of the plurality of supply nozzles about the overall front surface of the wafer mounted on the chuck; and an etching solution supplying device for supplying the etching solution to each of the plurality of supply nozzles and discharging the etching solution, respectively, from the discharge openings onto the front surface of the wafer, and wherein the apparatus further comprises a first supply nozzle which is an oscillating supply nozzle having a base end and having a tip with a discharge opening, the tip being distal from the base end, said first supply nozzle moving device oscillating the nozzle tip around the base end, and a second supply nozzle having a tip with a discharge opening, said second supply nozzle moving device moving the tip in an axial direction across the front surface of the wafer.

4. The method of claim 3, wherein the apparatus comprises more than one first supply nozzle and more than one second supply nozzle.

5. The method of claim 3, wherein the apparatus further comprises the plurality of sensors provided on the respective tips of the plurality of supply nozzles; and a controller for controlling one or both of the nozzle-moving devices and the etching solution supplying device according to detection outputs from the sensors.

* * * * *